United States Patent [19]

Traylor et al.

[11] Patent Number: 5,652,696
[45] Date of Patent: Jul. 29, 1997

[54] MECHANICALLY CAPTIVATED INTEGRATED CIRCUIT CHIP

[75] Inventors: Patrick A. Traylor, Los Alamitos; Richard A. Holloway, El Segundo, both of Calif.

[73] Assignee: Hughes Aircraft Company, Los Angeles, Calif.

[21] Appl. No.: 536,303

[22] Filed: Sep. 25, 1995

[51] Int. Cl.$^6$ .............................. H05K 7/02; H01L 21/58
[52] U.S. Cl. ..................... 361/764; 361/761; 361/783; 361/807; 333/247; 257/728; 437/209
[58] Field of Search ........................ 333/246, 247; 257/728, 731, 732, 733, 720; 437/209, 212, 216, 222, 214; 361/761, 764, 767–771, 803, 807–811, 783

[56] References Cited

U.S. PATENT DOCUMENTS

| | | | |
|---|---|---|---|
| 3,343,107 | 9/1967 | Golightly | 333/247 |
| 3,769,560 | 10/1973 | Miyake et al. | 257/728 |
| 4,164,003 | 8/1979 | Cutchaw | 361/783 |
| 4,232,277 | 11/1980 | Dickens et al. | 257/733 |
| 4,371,912 | 2/1983 | Guzik | 361/783 |
| 4,576,224 | 3/1986 | Eaton et al. | 257/720 |
| 4,835,495 | 5/1989 | Simonutti | 257/728 |
| 5,300,175 | 4/1994 | Gardner et al. | 437/212 |

OTHER PUBLICATIONS

Package Technique, G.B. Cherniack, M.D. Silver, E.M. Suden, IBM Technical Disclosure Bulletin, vol. 9 No. 11 Apr. 1967.

*Primary Examiner*—Donald Sparks
*Assistant Examiner*—John B. Vigushin
*Attorney, Agent, or Firm*—Elizabeth E. Leitereg; Terje Gudmestad; Wanda K. Denson-Low

[57] ABSTRACT

A high frequency microwave integrated circuit assembly (14,20) includes a fragile monolithic microwave integrated circuit (MMIC) chip (22) mounted in an MMIC subassembly (20) that is completely assembled, tested and burned in independent of the main high frequency microwave integrated circuit assembly and is mechanically attached to the main assembly by a captivation screw (100). The MMIC chip (22) is bonded to an uppermost tier (30) of a multi-tier spaced pedestal (26) and is received within an aperture (46) within a slave board (44) that itself is mounted and bonded to a lower tier (28) of the pedestal (26). The main integrated circuit assembly is formed with a rectangular opening (84) in an upper portion of its substrate to non-rotationally receive the rectangular slave board and a slightly larger internally threaded circular hole (94) in a lower portion of the main assembly substrate that threadedly receive the captivation screw (100). The configuration is such that the subassembly of pedestal, slave board and MMIC are interposed between the captivation screw and the main assembly substrate and physically captured by pressure of the screw which urges the subassembly of pedestal, slave board and chip against the lower side of the main assembly substrate.

17 Claims, 2 Drawing Sheets

MECHANICALLY CAPTIVATED INTEGRATED CIRCUIT CHIP

This invention was made with Government support under Contract No. F04701-92-C-0049 awarded by the Department of the Air Force. The Government has certain rights in this invention.

BACKGROUND OF THE INVENTION

1. Field of the Invention

The present invention relates to high frequency integrated circuit chip assemblies and more particularly concerns an improved method of mounting an integrated circuit chip to a main high frequency assembly.

2. Description of Related Art

High frequency circuitry that has been developed and used for many purposes, such as amplifiers of high frequency radar and communication systems, for example, often employs a substrate carrying high frequency microwave circuitry. The main high frequency assembly may include among its components a monolithic microwave integrated circuit chip (MMIC) capable of handling signals of very high frequencies, such as, for example, in the order of 18 to 20 gigahertz, or higher. The high frequency main assembly incorporates many circuit components which are individually fabricated, assembled and interconnected on the main assembly substrate. Components of the main assembly substrate are secured by soft or relatively low temperature soldering, whereas a MMIC chip requires hard solder or high temperature soldering. Required use of hard solder causes the MMIC chip to be difficult to attach and/or re-work in the main assembly, because use of the high temperature solders may degrade or even melt the softer soldering of the other components. Moreover, use of the soft solder requires flux, which is detrimental to a nearby MMIC chip already installed. Further, MMIC chips are very fragile devices, having a dimension of between 2×2 millimeters, or smaller, up to about 4×4 millimeters, or larger, and a total thickness in many instances no more than 0.004 inches. Thus, in the past, mounting of the MMIC chip on the main assembly has required the fragile chip to be exposed to work done on the other components, creating high potential for scrapping of the entire assembly. The potential dangers to the MMIC chip not only place this chip at risk, but also may result in damage to other electrical devices within the assembly and possibly to the carrier or header of the device.

In addition, the MMIC chip, as other chips, is required to be tested and to have certain of its circuit functions burned in. In the past this has generally been done after assembly of the very fragile MMIC chip on the main assembly. Once a MMIC device is successfully installed into a main assembly, the entire assembly is required to go through testing, screening, and burn-in procedures which apply only to the MMIC device. This creates a potential for damage to portions of the assembly other than the MMIC device. Testing failures discovered after assembly of the main system can be expensive and time consuming to repair, often requiring removal of different ones of the components, and the very thin and fragile MMIC chip.

Further, it has been discovered that hydrogen in sealed microelectronic packages has a detrimental effect on the performance of gallium arsenide MMIC devices, thereby requiring alternate methods of packaging. One such method that has been adopted is to vent the chip package so as to allow emerging hydrogen to escape before reaching detrimental levels. This approach, however, precludes the use of silver loaded epoxies for attachment of the MMIC chip because of silver migration caused by moisture levels in the air.

Assembly of a microwave or micro-strip system or circuit which contains a MMIC chip has been accomplished, in the past, in (chronological) series with the delivery of a working MMIC chip because of the fact that the MMIC chip must be installed before screening and lot qualification tests can be performed.

Accordingly, it is an object of the present invention to provide for installation of a fragile chip by arrangements and methods that avoid or minimize above-mentioned problems.

SUMMARY OF THE INVENTION

In carrying out principles of the present invention in accordance with a preferred embodiment thereof, an electronic assembly including a substrate and header has an integrated circuit chip mounted thereto by mounting the chip and a slave board on a pedestal and interposing the chip and slave board between the header and a captivation screw that threadedly engages the header. According to a specific feature of the invention, the slave board and chip are both mounted on a pedestal that is interposed between the captivation screw and the slave board. The slave board and pedestal are configured and arranged to be non-rotatably engaged with the system substrate to which the MMIC chip is mounted, and the captivation screw threadedly engages mating threads on the header to press the sub-assembly of pedestal, slave board and chip into the header without imparting any rotation.

By using a mechanically captivated subassembly of chip, slave board and pedestal, a subassembly is produced that is assembled, electrically interconnected, tested, screened and burned in completely independent of the main system assembly. This yields a number of significant advantages as follows.

The MMIC chip subassembly may be built in parallel with (at the same time) as the main system assembly. By being mechanically attached, the MMIC chip subassembly may be screened and installed at the end of the manufacturing procedures rather than at the beginning.

The main system assembly can be built using soft, low temperature solders and flux due to the fact that the MMIC chip subassembly, which cannot tolerate flux, is not present during these procedures.

The main assembly or microstrip assembly does not have to be exposed to the testing and burn-in procedures associated with individual screening and lot qualification procedures as required of a MMIC chip.

The MMIC chip is easily installed and removed for re-work or replaced with a new subassembly with minimum impact to the main or microstrip assembly and related package.

DESCRIPTION OF PREFERRED EMBODIMENTS

Figure 1:
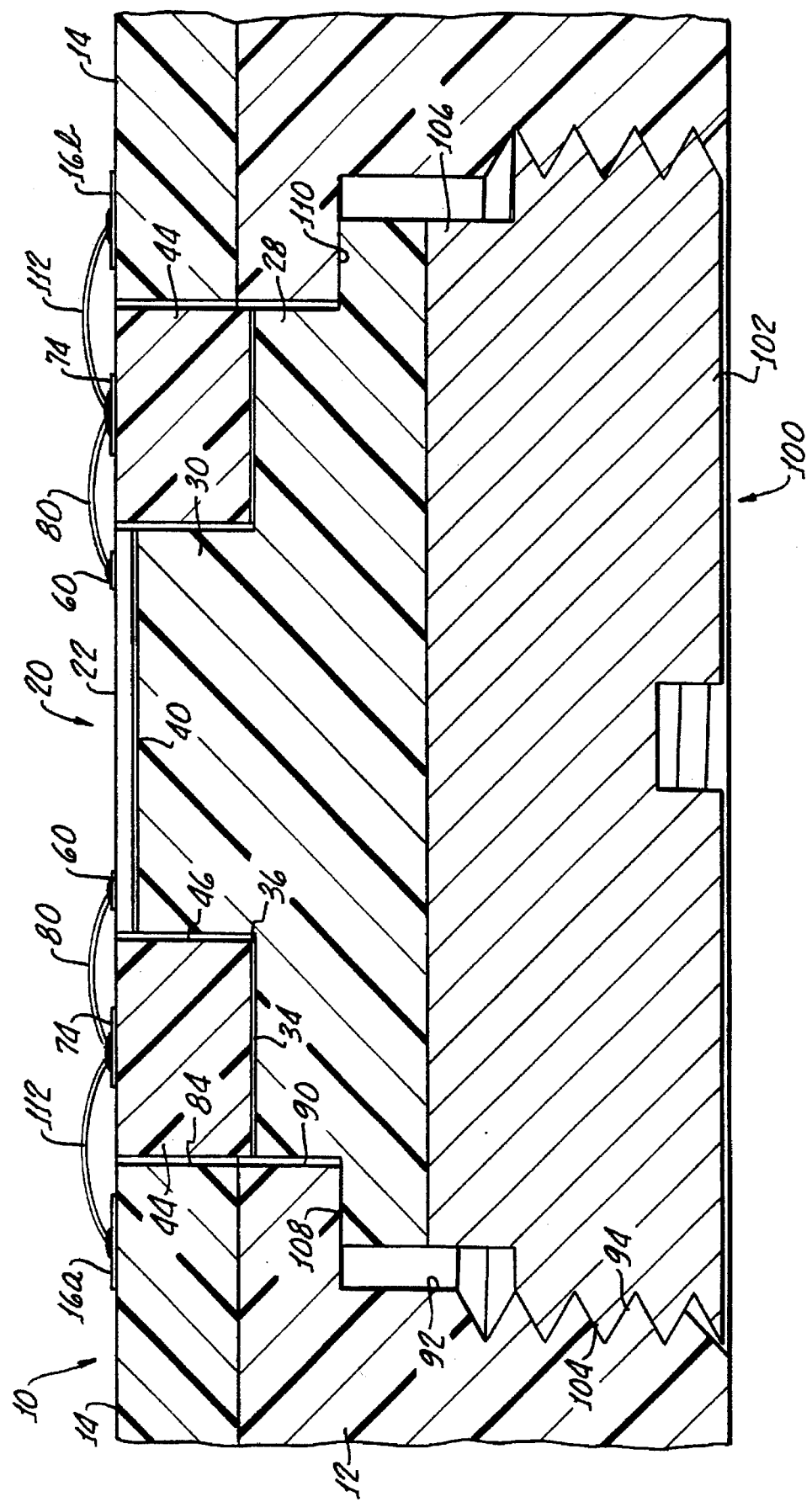
FIG. 1 is a sectional view, greatly enlarged, of a fragile chip subassembly mechanically attached to a main system assembly.

Illustrated in FIG. 1 is a fragmentary portion of a substrate/header generally indicated at 10, having a lower header portion 12 formed of a strong, rigid material, such as Kovar, for example. Other header materials may be used, as is well known. Bonded to the lower Kovar header portion 12 is an alumina (ceramic) substrate 14 upon which is formed a desired pattern of circuitry, including certain circuit connecting pads illustrated at 16a and 16b. The substrate/header 12,14 is the primary component of a main high frequency system assembly, which may be termed a "microwave integrated circuit or microstrip assembly", that provide any one of a number of different electronic functions, including various functions of radar or communication subsystems, or, in an exemplary case, a particular high frequency amplifier.

The substrate mounts a number of different electronic components, including integrated circuit chips, none of which are shown, except for an uniquely mounted monolithic microwave integrated circuit chip (MMIC) assembly, generally indicated at 20. The present description is related to the manner of mounting the MMIC subassembly 20 and its component parts and the structure and manner in which the subassembly 20 is mechanically connected to the main system assembly 12,14.

It will be understood that the integrated circuit chip of the subassembly 20 may be any one of a number of different type chips, but in the specific example disclosed herein for purposes of explanation, is a monolithic microwave integrated circuit chip, designated at 22. MMIC chip 22 is small and thin. Such chips may have a horizontal dimension (as viewed in the drawing) of between 2×2 millimeters, or smaller, up to about 4×4 millimeters, or larger. In a particular example the total thickness of chip 20 is 0.004 inches.

Figure 2:
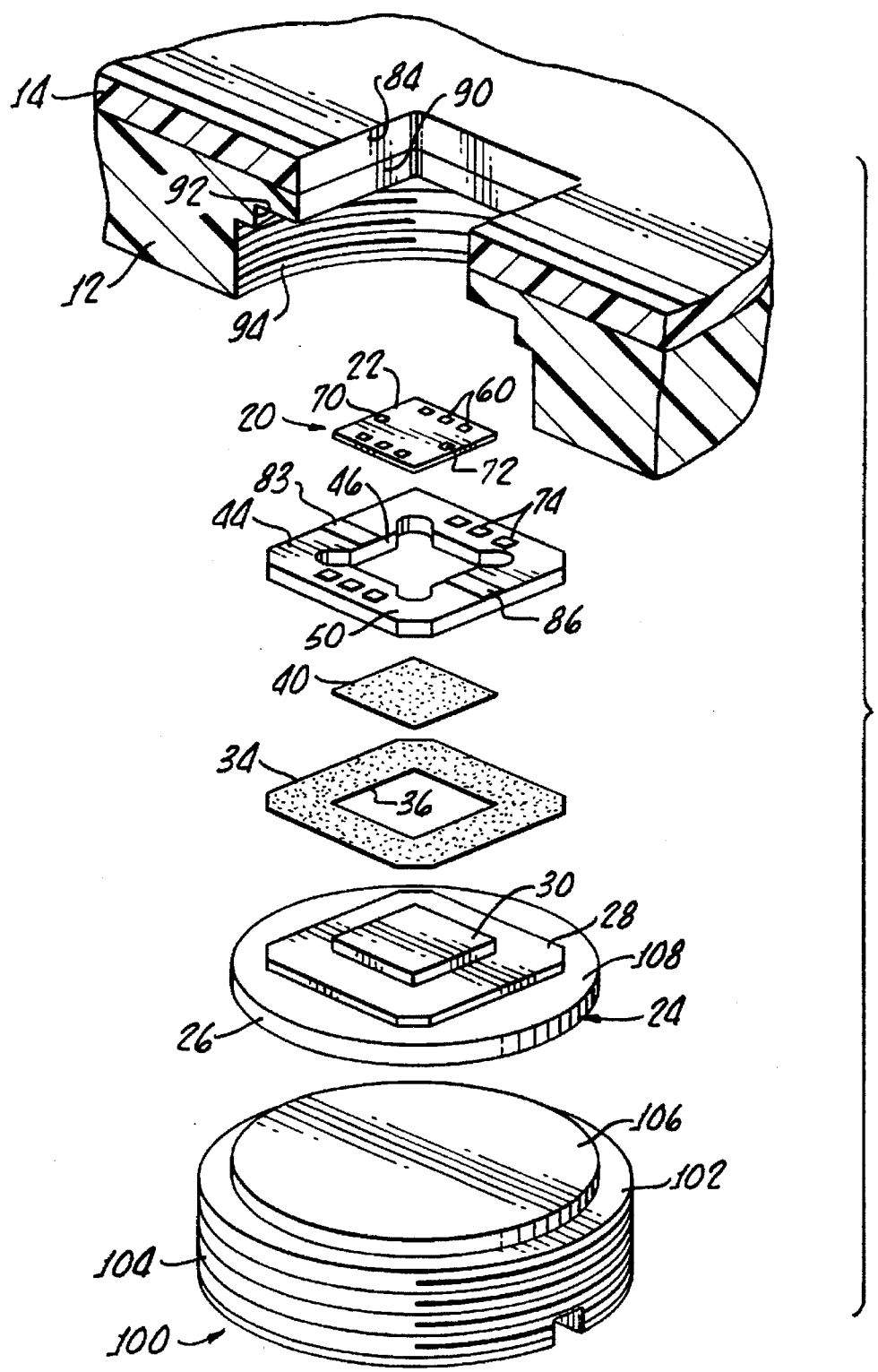
FIG. 2 is an exploded pictorial view of the components of FIG. 1.

As a base for the chip subassembly, there is provided a pedestal, generally indicated at 24, having a pedestal base 26, to the upper surface of which is bonded a first tier or first pedestal plate 28 of a rectangular configuration somewhat smaller than the circle of the base 26. To the upper surface of first pedestal plate 28 is mounted a second rectangular pedestal plate 30 that is significantly smaller than the first rectangular pedestal plate 28. A thin rectangular solder preform 34, having a rectangular opening 36 that receives second pedestal plate 30, is placed on the upper surface of first pedestal plate 28 and encircles the second pedestal plate 30. To the upper surface of second pedestal plate 30 is secured a second solder preform 40 of rectangular configuration and having a size slightly smaller than the upper surface of second pedestal plate 30 (see FIG. 2).

A slave board 44 formed of a suitable dielectric, such as an alumina, for example, is formed with the illustrated approximately skeletal rectangular configuration, having an outer perimeter that is substantially congruent with the outer perimeter of the first pedestal plate 28 and having an inner perimeter or aperture 46 that is congruent with the second pedestal plate 30 but slightly larger so that the slave board 44 may be placed over plate 30 and in contact with the upper surface of first pedestal plate 28 while the second pedestal plate 30 is received in and penetrates the slave board opening 46 nearly to the upper surface 50 of the slave board. Two or more individual alumina (or similar dielectric) pieces can make up the equivalent of one rectangular slave board, if deemed necessary or desirable. The very thin solder preform 40 is mounted upon the upper surface of the second pedestal plate 30. The rectangular chip, having a rectangular configuration that conforms to the configuration of the opening 46 in the slave board, is received in this opening and rests upon the upper surface of second pedestal plate 30 with the solder preform 40 interposed between the chip and the second pedestal plate.

Components of the pre-assembly of multi-tiered pedestal, slave board and MMIC chip are bonded together as a unit by heating the solder preforms to cause them to flow and securely bond the pedestal, slave board and chip to one another in a rigid unitary mechanical subassembly.

The MMIC chip is formed with a plurality of DC connecting pads, such as pads 60, and a pair of oppositely disposed (in this exemplary configuration) radio frequency connecting pads 70,72. The slave board is formed with a corresponding pattern, including a plurality of DC connecting pads 74, which are connected to the DC chip pads 60 by wire bonds, such as shown at 80 in FIG. 1. The slave board is also formed with a pair of radio frequency (RF) leads 83,86 which are positioned adjacent to and are electrically connected to corresponding radio frequency pads 70 and 72 on the MMIC chip.

The upper portion of substrate/header assembly 10 comprises a substrate 14 formed of alumina, or other suitable dielectric material, upon which are mounted the various circuitry and components of the system. Substrate 14 is fixedly bonded to the rigid header 12, which is formed of Kovar. At the location for the MMIC chip, upper portion or substrate 14 of the substrate/header assembly is formed with an aperture, generally indicated at 84, and having a rectangular configuration that closely mates with but is slightly larger than the rectangular configuration of second pedestal plate 28 and slave board 44. The lower portion of the assembly, Kovar header 12, is formed with rectangular aperture 90 that extends axially a short distance to a larger circular bore 92. The outermost or lower portion, as viewed in the drawings, of enlarged circular bore 92 is internally threaded, as at 94.

A generally cylindrical captivation screw 100 is formed with a main circular disc like portion 102 that is externally threaded, as at 104, with threads that mate with the threads 94 of the Kovar header 12. A relatively thin circular spacer plate 106 is fixedly bonded to, or integral with, the upper surface of the captivation screw 100 and has a diameter that is substantially equal to or slightly less than the diameter of the circular pedestal base 26.

The subassembly of pedestal, slave board and MMIC chip are pressed upwardly, without rotation, through the rectangular aperture of the Kovar header and into the rectangular aperture of the alumina substrate 14, either alone or by placing the subassembly on the captivation screw 102,106 and pressing the latter upwardly into the large circular aperture 92. As the screw and header threads interengage, the captivation screw is rotated so that the spacer plate 106 presses upwardly against the pedestal base 26. The rectangular exterior configuration of the slave board and the similar rectangular exterior configuration of the first pedestal plate 28 are both received, or at least partially received, within the rectangular openings 84,90 of the substrate 14 and header 12, and thus relative rotation of the pedestal, slave board, MMIC chip assembly relative to the substrate/header 14/12 is prevented. Thus, as the captivation screw rotates in the threads of the Kovar header, the interengaging surfaces of captivation screw spacer 106 and pedestal base 26 rotatably slide upon one another. Therefore, the threaded rotation of the captivation screw simply imparts an upward linear motion to the subassembly which cannot rotate because of the interengagement of the rectangular interfitting parts.

As the captivation screw is driven upwardly, moving the pedestal subassembly upwardly, upwardly facing portions of outer sections of the pedestal base plate 26 which extend beyond the first pedestal plate 28, indicated at 108 in the drawings, engage downwardly facing shoulders 110 on the header 12 and limit further upward motion of the subassembly. In final position the captivation screw presses the subassembly upwardly against the substrate header, with the pedestal base engaging the header and the uppermost surfaces of the slave board and MMIC chip substantially coplanar with one another and with the uppermost surface of substrate 14. It may be noted that the combined thicknesses of the MMIC chip and the second pedestal plate 30 is substantially equal to the total depth or thickness of the slave board 44, so that when the parts of the subassembly are assembled the upper surface of the MMIC chip is either coplanar with or extends not more than about one mil above the upper surface of the slave board.

After completion of the mechanical assembly, additional wire bonds or other suitable electrical connections, such as indicated at 112 (FIG. 1), are made between the pads 74 of the slave board and connecting pads 16a,16b formed on the surface of the alumina substrate 14. In a like manner suitable connections are made between the RF leads 83,86 of the slave board and connecting pads (not shown) on the alumina substrate, thereby connecting the RF circuits of the MMIC chip to the main system circuitry.

It will be understood that the described and illustrated assembly and subassembly may be made in many different sizes to accommodate different thicknesses of material and different sizes of chips. In one exemplary embodiment captivation screw 100 has an outside diameter of 0.375 inches, captivation screw spacer plate 106 and pedestal base 26 have an external diameter of 0.330 inches, pedestal plate 28 has a rectangular size in a particular example of 0.159× 0.178 inches, and second pedestal plate 30 is a square of 0.082 inches on a side. Similarly, the dimensions of hole 36 in solder preform 34 are sufficient to snugly receive the second pedestal plate 30 and the outer dimensions of this solder preform substantially conform to but are slightly smaller than the outer dimensions of the first pedestal plate 28. Dimensions of the solder preform 40 are substantially the same as but slightly less than dimensions of the second pedestal plate 30. External dimensions of the slave board 44 are substantially the same as external dimensions of the first pedestal plate 28, and hole 46 in the slave board is substantially the same size as, though slightly larger than, the second pedestal plate 30. Slave board hole 46 and the dimensions of the second pedestal plate are chosen to conform to and accept the external dimensions of the MMIC chip 22. Similarly, as can be best seen in FIG. 1, the rectangular opening 84 in the alumina substrate 14 is substantially the same as though slightly larger than the external rectangular configurations of the slave board 44 and first pedestal plate 28. The diameter of smaller bore 92 of the Kovar header 12 is slightly larger than the outer diameter of first pedestal plate 28 so that the latter may be snugly received within the circular opening 92, and pedestal base 26 is larger than the rectangular aperture 90 so that shoulder 110 acts as a stop.

A set of specific thickness in a particular embodiment of the invention is set forth immediately below by way of illustration without any intention of limiting the scope of the present invention. The individual thicknesses of the various parts are chosen to provide the assembled relations shown in FIG. 1. Captivation screw 100, for example, has a total thickness of about 0.068 inches, pedestal base 26 and first pedestal plate 28 each have a thickness, in a particular example, of 0.015 inches, whereas second pedestal plate 30 has a thickness of 0.021 inches.

Each of the solder preforms has a thickness of 0.001 inches, and slave board 44 has a thickness of 0.025 inches. The MMIC chip 22 is very thin (and very fragile), having a thickness of 0.004 inches in a specific example. In this example the lower portion 12 of the entire substrate/header assembly 10 has a thickness of 0.106 inches, whereas the alumina substrate 14 has a thickness of 0.025 inches. It will be understood that these thicknesses are approximate, being correct to within one or two thousandths, and are chosen to provide a snug mechanical interfitting of the parts, as shown in FIG. 1, with the captivation screw pressing the pedestal and the slave board and MMIC chip mounted thereon against the underside of the Kovar header. It will be seen that the thickness of the second pedestal plate 30 and the very small thickness of the MMIC chip combined are equal to or greater by about 1 mil than the thickness of the slave board 44. The solder preforms fixedly secure the MMIC chip to the second pedestal plate 30, and the slave board 44 to the first pedestal plate 28.

After mechanically assembling the pedestal, slave board and MMIC chip, the latter is electrically connected to the slave board by forming the wire bonds 80 and suitable RF connections (not shown). Having mechanically and electrically completed this subassembly (which is not yet installed), the MMIC chip, in its subassembly, may be now fully tested and burned-in, completely independently of the main microwave integrated circuit system. Thus, testing of the system circuits has no effect on the not yet installed MMIC chip subassembly, and, similarly, testing of the MMIC chip subassembly has no effect on the circuitry of the main microwave integrated circuit system.

After testing and mechanically installing and securing the MMIC chip subassembly, the connecting pads, such as pad 74 on the slave board, are wire bonded by wires 112 to the pads 16a,16b on the alumina substrate, and the RF connections (not shown) are made between the RF connectors (not shown) on the alumina substrate and the RF connections 83,86 on the slave board. The high temperatures of the hard soldering of the MMIC chip in its subassembly do not affect the circuits or components of the main system mounted on alumina substrate, nor does the flux applied for the soft lower temperature soldering of components on the alumina substrate adversely effect the not yet installed MMIC chip subassembly.

As previously mentioned, prior to mechanically installing the MMIC chip subassembly it is fully tested and burned-in as desired without adversely effecting in any way the circuits or components of the main assembly. Further, the MMIC chip can be readily installed and removed for re-work or replaced with a new MMIC chip subassembly with a minimum impact on the main assembly or its related packaging. For removing of the MMIC chip subassembly it is only necessary to detach the wire bonds 112 between the slave board and the main assembly and then remove the captivating screw, whereupon the entire MMIC chip subassembly may simply be detached from the system header and substrate.

What is claimed is:

1. An electronic assembly comprising:
  a substrate having electronic circuitry thereon;
  a header;
  a slave board;
  a pedestal;
  an integrated circuit chip mounted with said slave board on said pedestal; and
  a captivation screw threadedly engaged with said header, said chip, slave board and pedestal being interposed between and physically pressed between said header and said captivation screw.

2. The assembly of claim 1 wherein said slave board and chip are fixedly mounted to said pedestal, said pedestal being interposed between said screw and said slave board.

3. The assembly of claim 2 including slave board interengaging means on said substrate and slave board for preventing relative rotation of said slave board and substrate.

4. The assembly of claim 3 including pedestal interengaging means on said pedestal and slave board for preventing relative rotation of said pedestal and slave board.

5. The assembly of claim 2 including header interengaging means on said pedestal and header for limiting motion of said pedestal toward said header.

6. The assembly of claim 5 wherein said header interengaging means includes a shoulder on said header facing said pedestal and a laterally outwardly extending flange on said pedestal in engagement with said shoulder.

7. The assembly of claim 4 wherein said slave board interengaging means includes an aperture of non-circular configuration in said substrate, and wherein said slave board has a non-circular configuration corresponding to the configuration of said substrate aperture, said slave board being received in said aperture.

8. The assembly of claim 4 wherein said header has an aperture with a non-circular configuration, and wherein said pedestal includes a pedestal plate having a non-circular configuration corresponding to the non-circular configuration of said header aperture, said pedestal plate being at least partially received in said header aperture.

9. The assembly of claim 7 wherein said pedestal includes a base plate of circular configuration, a first pedestal plate fixed to said base plate and having a non-circular pedestal plate configuration, said aperture including an upper portion having said pedestal plate non-circular configuration and a larger lower internally threaded portion of circular configuration, said pedestal base having a diameter smaller than said internally threaded portion, said captivation screw having external threads threadedly engaged with said internally threaded portion of said aperture.

10. The assembly of claim 9 wherein said electronic assembly comprises a high frequency assembly, and wherein said chip comprises a monolithic microwave integrated circuit chip.

11. A method of securing an integrated circuit chip to a substrate assembly comprising the steps of:

forming a hole in the substrate assembly;

mounting an integrated circuit chip to a slave board having a configuration corresponding to the configuration of the hole in the substrate assembly;

connecting the integrated circuit chip and slave board to a pedestal to prevent relative rotation of the slave board and integrated circuit chip and pedestal;

screwing a captivation screw to said substrate assembly with said pedestal, slave board and chip interposed between said pedestal and substrate assembly, and with said slave board received in said hole; and preventing rotation of said slave board relative to said substrate.

12. The method of claim 11 wherein said step of preventing rotation of said slave board relative to said substrate assembly comprises forming said substrate assembly hole with a non-circular configuration, forming said slave board with said non-circular configuration of said substrate assembly hole, and inserting said slave board at least partly into said hole.

13. The method of claim 11 including the steps of electrically and environmentally testing said chip and said slave board prior to said step of screwing the captivation screw to said substrate assembly.

14. A microwave circuit assembly comprising:

a substrate assembly having circuitry thereon, said substrate assembly having an aperture therethrough, said aperture having a first upper and relatively smaller portion of non-circular configuration and a second lower relatively larger portion of circular configuration, the second larger portion being internally threaded;

a pedestal having a circular pedestal base with a diameter greater than one dimension of said relatively smaller aperture portion and smaller than the diameter of said second larger portion;

a first pedestal plate secured to said pedestal base, having a configuration conforming to the non-circular configuration of said relatively smaller aperture portion;

a slave board having a configuration conforming to the configuration of said relatively smaller aperture portion and being mounted to said pedestal;

an integrated circuit chip connected to said slave board; and a captivation screw having external threads threadedly engaged with said relatively larger portion and having a face portion pressed against said pedestal base, said slave board and chip being received in said non-circular relatively smaller portion of said substrate assembly aperture.

15. The microwave circuit assembly of claim 14 wherein said slave board has an opening formed therein, said pedestal including a second pedestal plate mounted on said first pedestal plate and having a configuration conforming to the configuration of said slave board opening, said second pedestal plate being received in said slave board opening, said integrated circuit chip being received within said slave board opening and contacting said second pedestal plate.

16. The assembly of claim 15 including electrical connections between said chip and said slave board and electrical connections between said slave board and said substrate assembly.

17. An integrated circuit chip mounting subassembly comprising:

a pedestal;

a slave board mounted to said pedestal and having a chip receiving opening therethrough; and an integrated circuit chip received in chip receiving opening of said slave board and bonded to said pedestal, wherein said pedestal comprises:

a circular pedestal base, a first rectangular pedestal plate secured to said base and having a maximum dimension less than the diameter of said pedestal base, and a second pedestal plate mounted to said first pedestal plate and having a dimension less than the dimension of said first pedestal plate and being configured to be closely received in the chip receiving opening of said slave board, said slave board being bonded to said first pedestal plate and said integrated circuit chip being bonded to said second pedestal plate, both said second pedestal plate and said integrated circuit chip being received within said chip receiving opening of said slave board.

* * * * *